(12) United States Patent
Galili et al.

(10) Patent No.: US 7,587,004 B2
(45) Date of Patent: Sep. 8, 2009

(54) METHOD FOR DECODING DATA USING WINDOWS OF DATA

(75) Inventors: Patrick Galili, Cannes (FR); Laurent Pilot, Antibes (FR); Andrea Ancora, Nice (FR)

(73) Assignee: ST-Ericsson SA, Geneva (CH)

( * ) Notice: Subject to any disclaimer, the term of this patent is extended or adjusted under 35 U.S.C. 154(b) by 567 days.

(21) Appl. No.: 10/527,888

(22) PCT Filed: Sep. 10, 2003

(86) PCT No.: PCT/IB03/03941

§ 371 (c)(1),
(2), (4) Date: Mar. 15, 2005

(87) PCT Pub. No.: WO2004/028004

PCT Pub. Date: Apr. 1, 2004

(65) Prior Publication Data
US 2006/0039509 A1 Feb. 23, 2006

(30) Foreign Application Priority Data
Sep. 18, 2002 (EP) .................................. 02292291

(51) Int. Cl.
*H04L 27/06* (2006.01)
(52) U.S. Cl. .................. 375/340; 375/316; 375/341; 375/262; 375/265
(58) Field of Classification Search .................. 375/316, 375/341, 340, 265, 262
See application file for complete search history.

(56) References Cited
U.S. PATENT DOCUMENTS

| 6,192,084 | B1 * | 2/2001 | Miyauchi et al. ............ 375/262 |
| 6,289,486 | B1 * | 9/2001 | Lee et al. ..................... 714/788 |
| 6,563,877 | B1 * | 5/2003 | Abbaszadeh ................. 375/242 |
| 6,769,091 | B2 * | 7/2004 | Classon et al. .............. 714/792 |
| 6,829,313 | B1 * | 12/2004 | Xu .............................. 375/341 |
| 6,856,657 | B1 * | 2/2005 | Classon et al. .............. 375/341 |
| 6,901,117 | B1 * | 5/2005 | Classon et al. .............. 375/341 |
| 6,996,765 | B2 * | 2/2006 | Wolf et al. ................... 714/755 |
| 7,197,691 | B2 * | 3/2007 | Beerel et al. ................. 714/795 |
| 7,200,799 | B2 * | 4/2007 | Wang et al. .................. 714/795 |
| 2001/0054170 | A1 * | 12/2001 | Chass et al. ................. 714/796 |
| 2002/0029362 | A1 * | 3/2002 | Stephen et al. .............. 714/752 |
| 2002/0118776 | A1 * | 8/2002 | Blankenship et al. ....... 375/340 |
| 2003/0028838 | A1 * | 2/2003 | Chang et al. ................ 714/755 |
| 2003/0115539 | A1 * | 6/2003 | Giese et al. ................. 714/786 |

FOREIGN PATENT DOCUMENTS

EP 1017178 7/2000

* cited by examiner

*Primary Examiner*—Shuwang Liu
*Assistant Examiner*—Kenneth Lam
(74) *Attorney, Agent, or Firm*—Michael C. Martensen; William J. Kubida; Hogan & Hartson LLP (57) ABSTRACT

The present invention relates to a method for decoding data, said method using windows (WID) of input data. The invention is characterized in that it comprises for a current window the steps of:—Performing a forward recursion, wherein said forward recursion is initialized with a forward state metric vector (a) from the upper stake (STK) of the previous window of the same step of the previous iteration, a window (WID) comprising a lower and an upper stake (STK), and—Performing a backward recursion, wherein said backward recursion is initialized with a backward state metric vector (b) from the lower stake (STK) of the next window of the same step of the previous iteration. Use: Receiver in a communication system.

11 Claims, 4 Drawing Sheets

METHOD FOR DECODING DATA USING WINDOWS OF DATA

FIELD OF THE INVENTION

The present invention relates to a method for decoding data, said method comprising iterations with some steps using windows of input data.

Such a method may be used in particular in any system using UMTS standard or some satellite communication.

BACKGROUND OF THE INVENTION

In a system using the UMTS standard defined in the standard 3GPP (3GPP TS 25.212); data are decoded when they are received in a receiver of such a system. Such a receiver comprises a decoder in an integrated circuit. Said decoder also currently called turbo-decoder comprises two soft input-soft output steps also called SISO which are inter-dependant. A SISO step signifies the decoding of input data alternatively with interleaved data streams (called SISO2) or with non-interleaved data streams (called SISO1).

During the decoding process, a trellis of the possible states of the coding is defined.

In the document referenced "Implementation issues of 3rd generation mobile communication turbo decoding". (J. Dielissen and J. Huisken). In 21st Symposium on Information Theory in Benelux, pages 9-16, May 2000, Wassenaar, The Nederlands, the decoding of a data block B is done in the following manner.

A SISO step manages some forward recursion processing forward state metric vectors α, some backward recursion processing state metric vectors β and these state metric vectors are used in an extrinsic calculation outputting some probability factors λ, within the trellis of possible states of coding.

In order to perform the decoding, a system of sliding windows is used. It is based on a split of the input data received by the receiver into windows of data.

Figure 1:
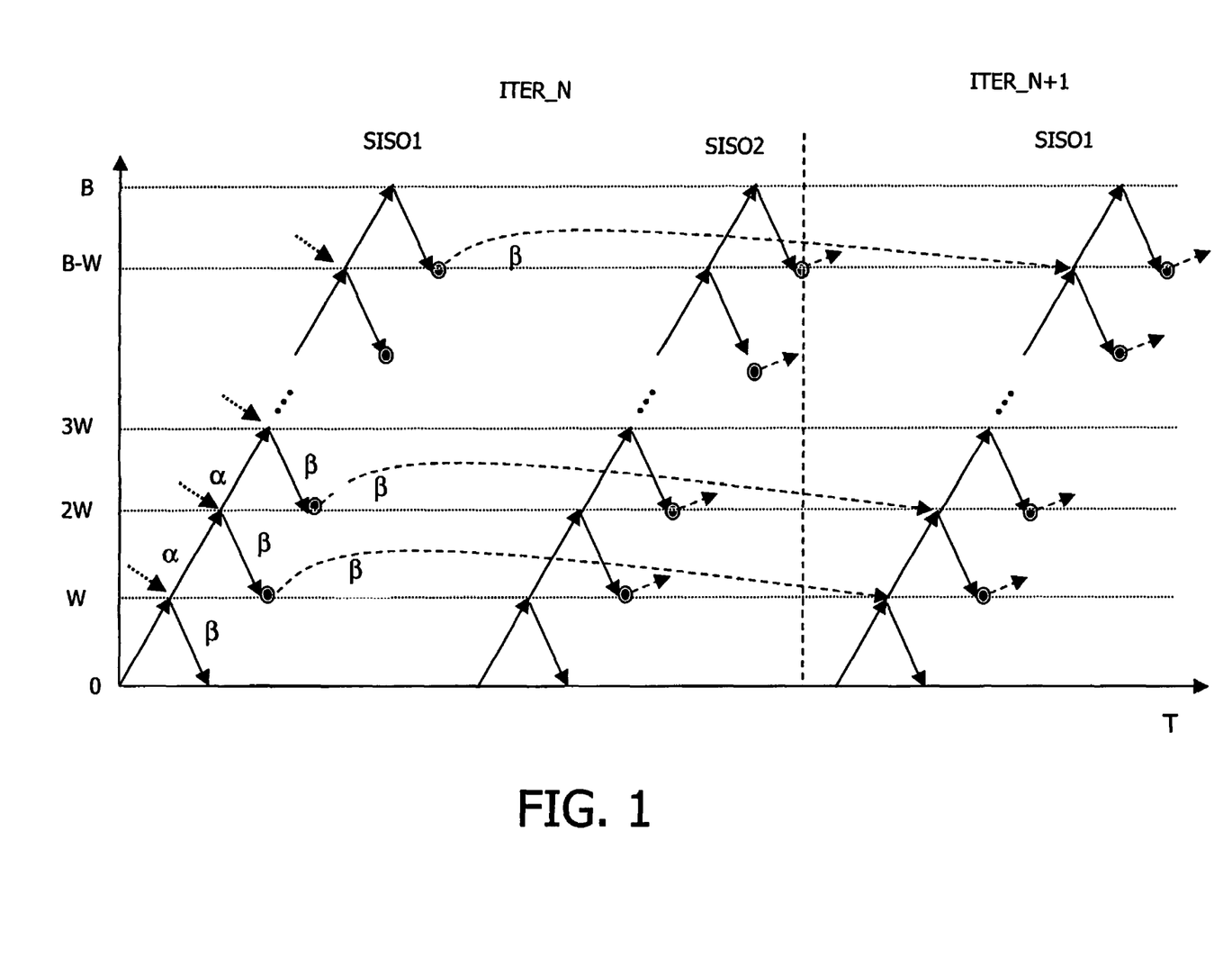
FIG. 1 illustrates a data flow temporal view using a sliding window principle according to the prior art.

The principle of the sliding windows is shown on FIG. 1.

A data block B received by the decoder is split into windows of size W and one unique computation unit is executing the 2 SISO steps. Said unit computes in a sequential way, window after window the state metrics and the probability factor of each SISO step. A plurality of iterations is performed in order to converge to the right factor of probability. A single iteration comprises a first and a second SISO step.

At a first iteration ITER_N, the computation unit performs the computations of the first SISO step SISO1.

For a first window 0-W, the computation unit does a first forward recursion and processes a first set of forward state metrics α. During the second window W-2W, the computation unit performs a second forward recursion and processes a second set of forward state metrics α. In parallel with this second forward recursion, it performs a first backward recursion that processes a first set of backward state metrics β. Note that the probability factor λ calculation starts immediately after the corresponding backward state metrics vector β has been calculated.

During the third window 2W-3W, the computation unit performs a third forward recursion, and a second backward recursion and so on until the last window (B-W)-B of the first iteration ITER_N.

Then the computation unit performs exactly the same kind of computations for the second SISO step SISO2.

Note that, during backward recursion, at each new window the last backward state metric vector β is saved. It will be used to initialize the next iteration's previous window at the same SISO step (SISO 1 in case of SISO 1 and SISO 2 in case of SISO 2). One window is thus dependant from on another window.

One major problem of the prior art is that for high throughput of data, the solution of the prior art is too time consuming.

SUMMARY OF THE INVENTION

Accordingly, it is an object of the invention to provide a method and a decoder for decoding data using windows of input data, which achieve an efficient decoding by improving the time consumption of the SISO computing.

To this end, a method is provided comprising, for a current window of a step within an iteration, the steps of:

Performing a forward recursion, wherein said forward recursion is initialized with a forward state metric vector from the upper stake of a previous window of the same step of a previous iteration, a window comprising a lower and an upper stakes, and Performing a backward recursion, wherein said backward recursion is initialized with a backward state metric vector from the lower stake of a next window of the same step of a previous iteration.

In addition, a decoder is provided, which comprises computation units for performing, for a current window of a step within an iteration:

A forward recursion, wherein said forward recursion is initialized with a forward state metric vector from the upper stake of a previous window of the same step of a previous iteration, a window comprising a lower and an upper stakes, and A backward recursion, wherein said backward recursion is initialized with a backward state metric vector from the lower stake of a next window of the same state of a previous iteration.

As we will see in detail further on, such a method enables to reduce the time taken. Via the initializations made for a window from a same kind of step of a previous iteration and not of the iteration it belongs to, all the window computations of a step will be able to be performed in parallel.

BRIEF DESCRIPTION OF THE DRAWINGS

Additional objects, features and advantages of the invention will become apparent upon reading the following detailed description and upon reference to the accompanying drawings in which.

DETAILED DESCRIPTION OF THE INVENTION

In the following description, well-known functions or constructions to a person skilled in the art are not described in detail since they would obscure the invention unnecessarily.

The present invention relates to a method for decoding data using sliding windows. Said method is used in particular in a turbo-decoder within an integrated circuit, said integrated circuit being embedded in a UMTS communication system comprising a transmitter and a receiver and more particularly in said receiver, for example a receiver of a base station.

The receiver receives some input data, which are coded by common general coding schemes well known to the person skilled in the art. The receiver through its turbo decoder has to decode the coded input data in order to recover the signal, this was transmitted by the transmitter.

To this end, during the decoding, a trellis of the possible states of the coding is defined, and the decoding process comprises two SISO steps (Soft Input Soft Output), wherein the SISO steps are the decoding of a window of data WID (defined in detail afterwards) or a complete signal, wherein said decoding comprises a forward recursion, a backward recursion and an extrinsic calculation with interleaved data (called SISO2) and with non-interleaved data (called SISO1) respectively.

Figure 2:
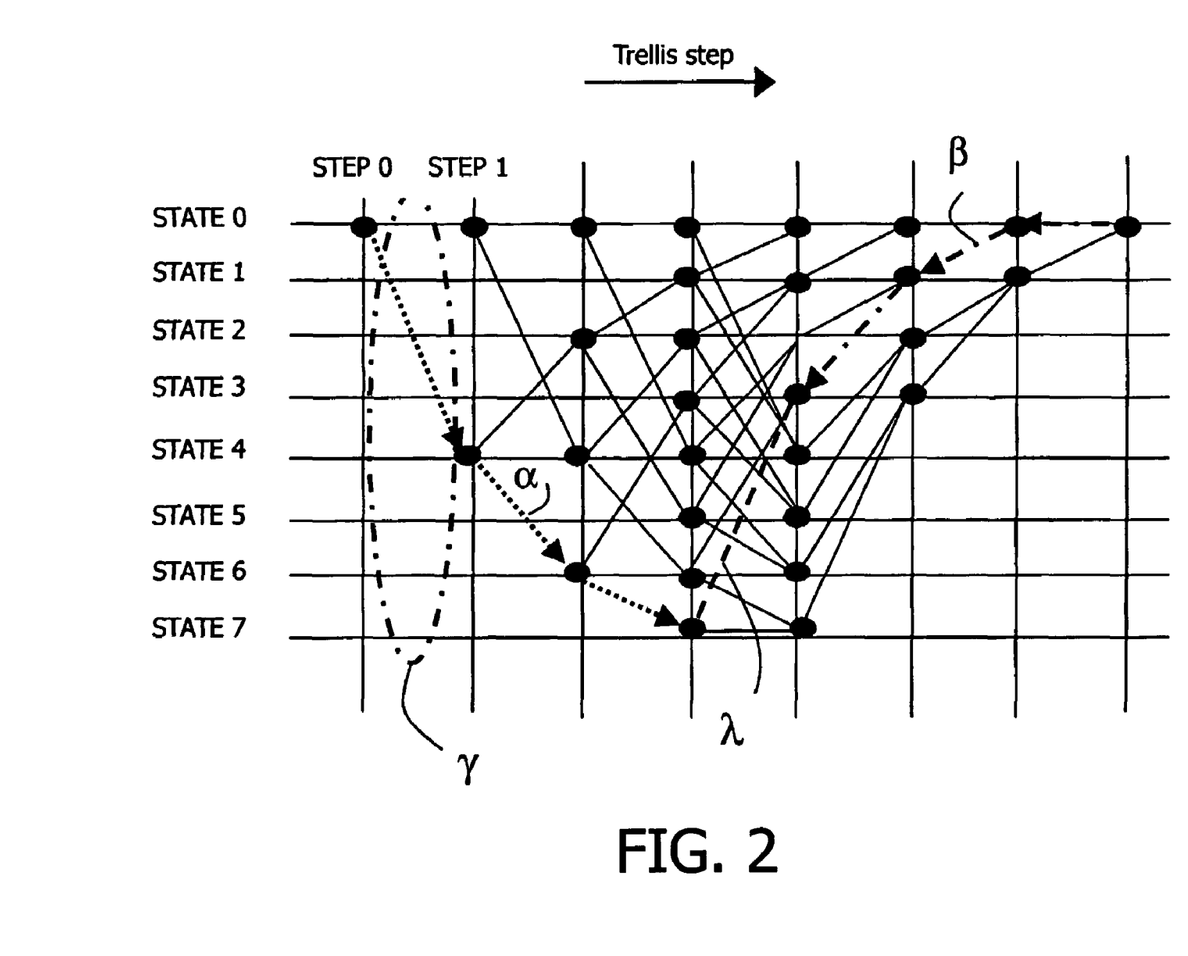
FIG. 2 illustrates a trellis of possible states of a coding which is used by the method of the invention.

As illustrated in FIG. 2, the trellis is composed of 8 possible states STATE. Given an input data, also called the systematic, the corresponding coded input data also called the parity input data and the a-priori information (from the previous SISO step), each transition from one state to another state is characterized by a branch metric vector $\gamma$. At each trellis step a forward state metric vector $\alpha$ is computed from the previous state metric vector $\alpha$ and the associated branch metric vector $\gamma$, and a backward state metric vector $\beta$ is computed from the next state metric vector $\beta$ and the associated branch metric vector $\gamma$. When at a given trellis step both state metric vectors ($\alpha$ and $\beta$) have been calculated, an extrinsic value, i.e. a probability factor $\lambda$ can be processed from these state metrics and the branch metric vectors.

Each SISO step interacts with the other by using information coming from the other SISO. A SISO step outputs an extrinsic calculation $\lambda$, which is used by the next SISO step as A-priori information.

This extrinsic information evaluates the probability that a 0 or a 1 signal was transmitted.

A plurality of iterations of SISO steps is performed in order to converge gradually to the right factor of probability $\lambda$ and thus to the right coded signal. A single iteration comprises a first SISO1 and a second SISO2 step.

In order to decode the received input data, the turbo decoder uses a system of sliding windows of data that is applied to the input data. The system of sliding windows is based on a split of an input data block B into windows of data, a window WID of data having a size that can be different from other windows WID.

Note that with the block B of data, some tail bits are transmitted by the transmitter to the receiver, and thus to the decoder.

The decoding of an input data block B is done as follows:

The whole data block B is split preferentially into equal-size windows WID. A computation unit COMP is allocated to each window WID of a data block B in order to reduce the latency of the decoding. A window comprises some initialization points that are called stakes STK.

Two stakes STK, a lower one and an upper one characterize a window WID. Practically we can see in the FIG. 3 that the lower stake also represents the low limit of a window, and the upper stake the upper limit of a window.

Figure 3:
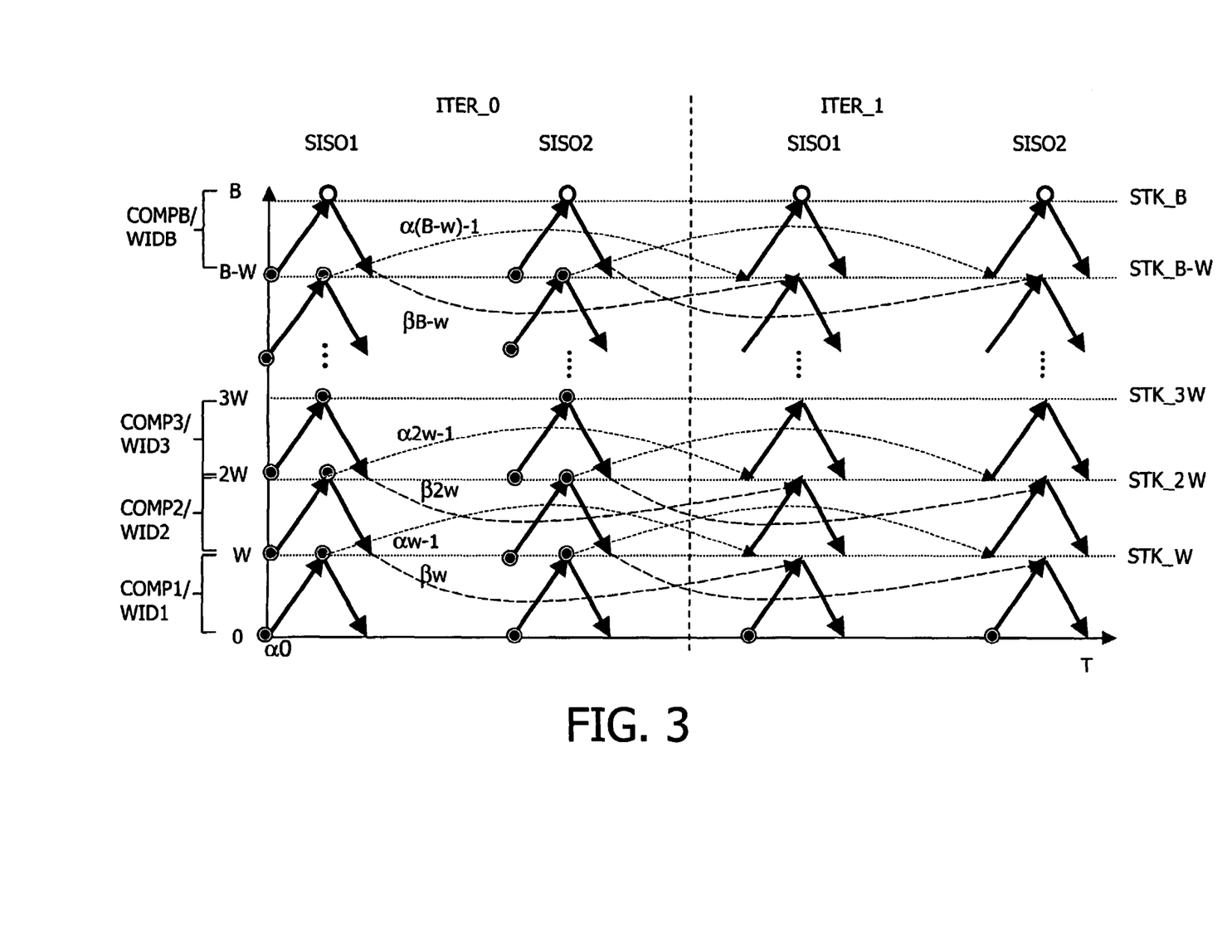
FIG. 3 illustrates a data flow temporal view using a sliding window principle according to the method of the invention.

The upper stakes initialized by the previous window WID computations of the previous iteration SISO step, are used for computing the forward state metric vector $\alpha$ of the current window WID of the current iteration's respective SISO step.

The lower stakes initialized by the next window WID computations of the previous iteration SISO step, are used for computing the backward state metric vector $\beta$ of the current window WID of the current iteration's respective SISO step.

Note that the tail bits transmitted with the block B of data to be decoded are used to initialize the backward recursion of the last window WID. The last state metric vector $\beta$ is obtained by doing a trace back from the known initial state 0 STATE0 using said tail bits. This is done at the beginning of the decoding process by a unit called termination generator.

At the beginning of decoding, the stakes STK can be initialized with a uniform arbitrary state metric values (e.g. 0). Naturally, efficient Implementation-BCJR initialization technique (a training forward and backward recursion is done to initialize the first iteration instead of arbitrary values), well known by the person skilled in the art, can also be used but as it is really time consuming, it can affect overall performance.

Each computation unit COMP of the turbo decoder can then independently process its associated window WID during a SISO step:

The forward recursion is initialized with the forward state metric $\alpha$ value from the upper stake of the previous window in the previous respective SISO step, i.e. the previous window of the same SISO step (SISO1 or SISO2) in the previous iteration, The forward recursion finished, the forward state metric $\alpha$ computed last is stored in the upper stake of the current window, The backward recursion is initialized with backward state metric $\beta$ value from the lower stake of the next window in the previous respective SISO step, i.e. the next window of the same SISO step (SISO1 or SISO2) in the previous iteration, The backward recursion finished, the backward state metric $\beta$ computed last is stored in the lower stake of the current window.

Preferably, the previous window of a same SISO step in the previous iteration is the immediately preceding window of a same type of SISO step (either the type SISO1 or the type SISO2) in the immediately preceding iteration, and the next window of the same SISO step in the previous iteration is the consecutive window of the same kind of SISO step in the immediately preceding iteration.

An example of such decoding is illustrated in the FIG. 3. On the diagram of the FIG. 3, the X-axis represents the time and the Y-axis represents the windows WID that are processed. In this example, there are 2 iterations $ITER\_0$ and $ITER\_1$. We suppose that a window WID has four input data to be computed.

During the first iteration ITER_0, the following steps are performed.

In a first step 1), a first SISO step SISO1 is performed by the different computation units COMP associated to its windows WID.

A first computation unit COMP1 processes the first window WID1 (0-W) of size W of the input data block B.

There is a forward recursion computation, which computes the forward state metric vectors $\alpha$ of said first window WID1, wherein said forward recursion is initialized, with arbitrary value, 0 for example, that is to say, the first forward state metric vector $\alpha 0$ has the value 0.

This forward recursion finished, the forward state metric vector $\alpha$ computed last, is stored in the upper stake STK_W-SISO1 of this window WID1.

Then, there is a backward recursion, which computes the backward state metric vectors $\beta$ of this first window WID1, wherein said backward recursion is initialized, with 0 for example, that is to say the last backward state metric vector $\beta 3$ has the value 0.

The backward recursion finished, the backward state metric vector β computed last, here β0, is not stored in a stake STK, as it will not be used in any SISO step.

In parallel with this first window WID1 processing, the other windows WID2, WID3, . . . are processed by a second, third . . . computation unit COMP2, COMP3 . . . respectively. Their processes are the same as for the first window WID1 described above except for their last backward state metric vector β, which is stored in the lower stake STKSISO1.

For the last window WIDB, the forward recursion finished, the last forward computed state metric vector α of this window WIDB is not stored in a stake, as it will not be used.

Then, the backward recursion is initialized with a metrics vector computed by the termination generator, wherein this vector is a function of the tail bits, and is processed. The backward recursion finished, the backward state metric β0 computed last is stored in the lower stake STK_B-WSISO1 for the next iteration's SISO1 step.

Note that in the FIG. 3, all the plain gray-circles define the current recursions initialized with 0, and all the transparent circles defined the current recursions initialized with the vector from the termination generator.

In a second step 2), the second SISO step SISO2 is performed by the different computation units COMP associated with its windows WID. Note that these computation units COMP are the same as those for the first SISO step SISO1, as the windows are the same.

The first computation unit COMP1 processes the first window WID1 of size W of the input data block B.

There is a forward recursion computation, which computes the forward state metric vectors α of said first window WID1, wherein said forward recursion is initialized, with 0, that is to say, the first forward state metric vector α0 has the value 0.

This forward recursion finished, the forward state metric vector α3 computed last is store in the upper stake STK_W-SISO2 of this window WID1.

Then, there is a backward recursion, which computes the backward state metric vectors β of this first window WID1. Said backward recursion is initialized, with 0 for example, that is to say, the last backward state metric vector β3 has the value 0.

The backward recursion finished, the backward state metric vector β computed last is not stored in a stake, as it will not be used in any SISO step.

In parallel with this first window WID1 processing, the other windows WID2, WID3, . . . are processed by a second, third . . . computation units COMP2, COMP3 . . . respectively.

Their processes are the same as for the first window WID1 described above except for their last backward state metric vectors β, which are stored in the lower stakes STKSISO2.

During the second iteration ITER_1, the following steps are performed.

In a first step 1), a first SISO step SISO1 is performed by the different computation units COMP associated to its windows WID.

There is a forward recursion computation, which computes the forward state metric vectors α of said first window WID1, wherein said forward recursion is initialized, with arbitrary value, 0 for example, that is to say, the first forward state metric vector α0 has the value 0.

This forward recursion finished, the forward state metric vector α computed last is stored in the upper stake STK_W-SISO1 of this window WID1.

Then, there is a backward recursion, which computes the backward state metric vectors β of this first window WID1, wherein said backward recursion is initialized, with the lower stake of the next window WID2 of the previous respective SISO1 step.

The backward recursion finished, the backward state metric vector β computed last, here β0, is not stored in a stake STK, as it will not be used in any SISO step.

In parallel with this first window WID1 processing, the other windows WID2, WID3, . . . are processed by a second, third . . . computation unit COMP2, COMP3 . . . respectively.

For each of these windows,
The forward recursion is initialized with the forward state metric vector α from the upper stake STKSISO1 of the previous window of the previous iteration SISO1 step,
The forward recursion finished, the forward state metric vector α computed last is stored in the upper stake STK-SISO1 of the current window,
The backward recursion is initialized with the backward state metric vector β from the lower stake STKSISO1 of the next window of the previous iteration SISO1 step,
The backward recursion finished, the backward state metric vector β computed last is stored in the lower stake STKSISO1 of the current window.

For example, for the second window WID2 (W-2W), the forward recursion is initialized with the forward state metric vector α3 of the upper stake STK_W SISO1 of the window WID1 of the previous iteration SISO1 step, and the forward state metric vector α7 computed last is stored in the upper stake STK_2WSISO1 of this current window. The backward recursion is initialized with the backward state metric vector β8 of the lower stake STK_3WSISO1 of the window WID3 of the previous iteration SISO1 step, and the backward state metric vector β4 computed last is stored in the lower stake STK_2WSISO1 of this current window.

For the last window WIDB, the forward recursion is initialized with the last forward state metric vector α(b-W-1) from the lower stake STK_B-WSISO1. The forward recursion finished, the state metric vector α(B-1) computed last of this window WIDB is not stored in a stake STK, as it will not be used.

Then, the backward recursion is initialized with a state metric vector computed by the termination generator, wherein said vector is a function of the tail bits, and is processed. The backward recursion finished, the backward state metric vector β(B-W) computed last is stored in the lower stake STK_BWSISO1 for the next iteration ITER_2 and thus for the next SISO1 step.

In a second step 2), the second SISO step SISO2 is performed by the different computation units COMP associated with its windows WID. Note that these computation units COMP are the same as those for the first SISO step SISO1, as the windows are the same.

The first computation unit COMP1 processes the first window WID1 of size W of the input data block B.

There is a forward recursion computation, which computes the forward state metric vectors α of said first window WID1, wherein said forward recursion is initialized, with arbitrary value, 0 for example, that is to say, the first forward state metric vector α0 has the value 0.

This forward recursion finished, the forward state metric a computed last is stored in the upper stake STK_WSISO2 of this window WID1.

Then, there is a backward recursion, which computes the backward state metric vectors β of this first window WID1, wherein said backward recursion is initialized, with the lower stake of the next window WID2 of the previous respective SISO2 step.

The backward recursion finished, the backward state metric vector β computed last, here β0, is not stored in a stake STK, as it will not be used in any SISO step.

In parallel with this first window WID1 processing, the other windows WID2, WID3, . . . are processed by a second, third . . . computation unit COMP2, COMP3 . . . respectively.

For each of these windows,

The forward recursion is initialized with the forward state metric vector α from the upper stake STKSISO2 of the previous window of the previous iteration SISO2 step, The forward recursion finished, the forward state metric vector α computed last is stored in the upper stake STK-SISO2 of the current window, The backward recursion is initialized with the backward state metric vector β from the lower stake STKSISO2 of the next window of the previous iteration SISO2 step, The backward recursion finished, the backward state metric vector β computed last is stored in the lower stake STKSISO2 of the current window.

For example, for the second window WID2 (W-2W), the forward recursion is initialized with the forward state metric vector a3 of the upper stake STK_WSISO2 of the window WID1 of the previous iteration SISO2 step, and the forward state metric vector α computed last is stored in the upper stake STK__2WSISO2 of this current window. The backward recursion is initialized with the backward state metric vector β8 of the lower stake STK__3WSISO2 of the window WID3 of the previous iteration SISO2 step, and the backward state metric vector β4 computed last is stored in the lower stake STK__2WSISO2 of this current window.

For the last window WIDB, the forward recursion is initialized with the last forward state metric vector α(B-W-1) from the lower stake STK_B-WSISO2. The forward recursion finished, the state metric vector α(B-1) computed last of this window WIDB is not stored in a stake STK, as it will not be used.

Then, the backward recursion is initialized with a metric vector computed by the termination generator, wherein said vector is a function of the tail bits, and is processed. The backward recursion finished, the backward state metric vector β(B-W) computed last is stored in the lower stake STK_BWSISO2 for the next iteration ITER__3 and thus for the next SISO2 step.

As we can see, thanks to the method according to the invention, we gain a lot of time because all the computations for the windows during one SISO step are done in parallel thanks to the system of initialization state metric issued from the previous step. Indeed, in a SISO step, all the windows are now independent of each other, as they do not need the results of another window of this SISO step anymore for being processed.

This example illustrated in FIG. 3 was for an ideal data block B. But, often we do not receive an ideal data block B, but a conventional data block B. A conventional data block B has a last window WID that is smaller than the others, i.e. that contains a smaller number of data. In other words, the size of the last window is different from the size of the other windows.

As it may be noted, the method according to the invention applies well to an ideal data block sequence as well as a conventional data block.

It is to be understood that the present invention is not limited to the aforementioned embodiments and variations and modifications may be made without departing from the spirit and scope of the invention as defined in the appended claims. In this respect, the following closing remarks are made.

Figure 4:
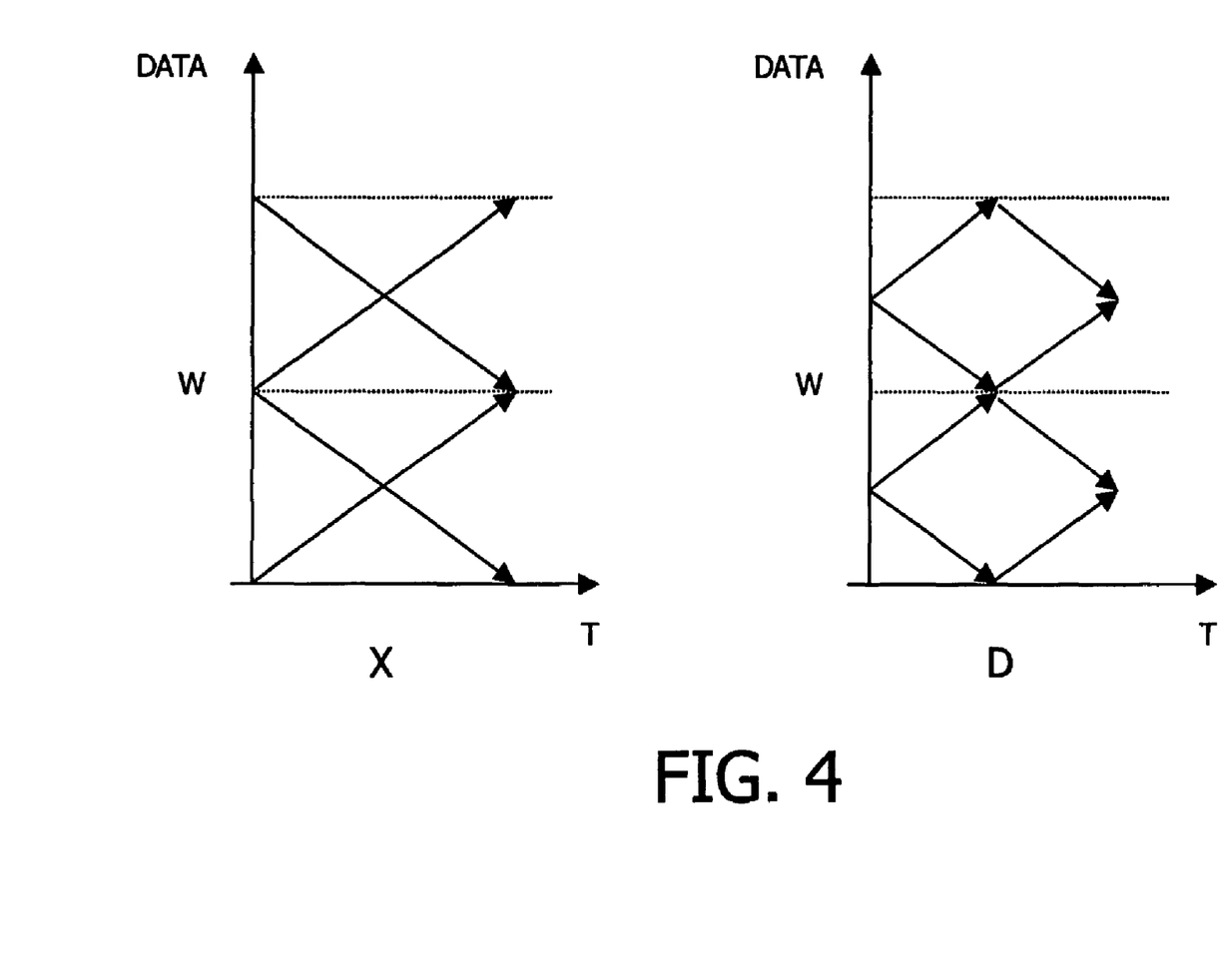
FIG. 4 illustrates two other structures of decoding using a sliding window principle to which the method of the invention is applicable.

It is to be understood that the present invention can also be applied to other SISO structures where forward and backward recursions are processed in parallel: "X" or "D" structures as shown in the FIG. 4. Indeed, in these structures, the forward and backward recursions can also be initialized with the stakes from the previous SISO step.

It is to be understood that the present invention is not limited to the aforementioned UMTS application. It can be use in any application using a turbo-decoder for decoding data using windows of data.

It is to be understood that the method according to the present invention is not limited to the aforementioned implementation.

There are numerous ways of implementing functions of the method according to the invention by means of items of hardware or software, or both, provided that a single item of hardware or software can carry out several functions. It does not exclude that an assembly of items of hardware or software or both carry out one function, thus forming a single function without modifying the method of source decoding in accordance with the invention.

Said hardware or software items can be implemented in several manners, such as by means of wired electronic circuits or by means of an integrated circuit that is suitably programmed, respectively. The integrated circuit can be contained in a computer or in a decoder. In the second case, the decoder comprises computation units adapted to perform forward and backward recursions, as described previously, said units being hardware or software items as stated above.

The integrated circuit comprises a set of instructions. Thus, said set of instructions contained, for example, in a computer programming memory or in a decoder memory may cause the computer or the decoder to carry out the different steps of the decoding method.

The set of instructions may be loaded into the programming memory by reading a data carrier such as, for example, a disk. A service provider can also make the set of instructions available via a communication network such as, for example, the Internet.

Any reference sign in the following claims should not be construed as limiting the claim. It will be obvious that the use of the verb "to comprise" and its conjugations does not exclude the presence of any other steps or elements besides those defined in any claim. The article "a" or "an" preceding an element or step does not exclude the presence of a plurality of such elements or steps.

The invention claimed is:

1. A method for decoding data, said method comprising iterations with some steps (SISO1, SISO2) using windows of input data, characterized in that the method comprises, for a current window of a step (SISO1, SISO2) within an iteration the steps of:

Performing a forward recursion, wherein said forward recursion is initialized with a forward state metric vector (α) from an upper stake of a previous window of a same step (SISO1, SISO2) of a previous iteration, each window comprising a lower and said upper stake, wherein the lower stake comprises a lower metric vector initialization value independent of time and the upper stake comprises an upper metric vector initialization value independent of time; and Performing a backward recursion, wherein said backward recursion is initialized with a backward state metric vector (β) from the lower stake of a next window of the same step (SISO1, SISO2) of a previous iteration.

2. A method as claimed in claim 1, characterized in that the forward state metric vector (α) computed last is stored in the upper stake of said current window during the forward recursion, and the backward state metric vector (β) computed last is stored in the lower stake of said current window during the backward recursion.

3. A method as claimed in claim 1, characterized in that all windows of a step (SISO) are processed in parallel.

4. A decoder for decoding data, said decoding comprising iterations with some steps (SISO1, SISO2) using windows of input data, characterized in that it comprises computation units for performing, for a current window of a step (SISO1, SISO2) within an iteration:

A forward recursion, wherein said forward recursion is initialized with a forward state metric vector (α) from an upper stake of a previous window of a same step (SISO1, SISO2) of a previous iteration, each window comprising a lower and said upper stake, wherein the lower stake comprises a lower metric vector initialization value independent of time and the upper stake comprises an upper metric vector initialization value independent of time; and A backward recursion, wherein said backward recursion is initialized with a backward state metric vector (β) from the lower stake of a next window of the same step (SISO1, SISO2) of a previous iteration.

5. A receiver adapted to receive input data, said input data being processed by the decoder as claimed in claim 4.

6. A computer program product for a receiver, comprising a set of instructions which, when loaded into said receiver, causes the receiver to carry out the method as claimed in claim 1.

7. A computer program product for a computer, comprising a set of instructions which, when loaded into said computer, causes the computer to carry out the method as claimed in claim 1.

8. A decoder for decoding data, as claimed in claim 4, said decoding characterized in that the forward state metric vector (α) computed last is stored in an upper stake of said current window during the forward recursion, and the backward state metric vector (β) computed last is stored in the lower stake of said current window during the backward recursion.

9. A decoder for decoding data, as claimed in claim 4, said decoding characterized in that all the windows of step (SISO) are processed in parallel.

10. A method as claimed in claim 1, characterized in that the backward recursion is initialized with a metrics vector computed by a termination generator, wherein the metric vector is a function of tail bits, and is processed.

11. A decoder for decoding data, as claimed in claim 4, said decoding characterized in that the backward recursion is initialized with a metrics vector computed by a termination generator, wherein the metric vector is a function of tail bits, and is processed.

* * * * *

UNITED STATES PATENT AND TRADEMARK OFFICE
CERTIFICATE OF CORRECTION

| | |
|---|---|
| PATENT NO. | : 7,587,004 B2 |
| APPLICATION NO. | : 10/527888 |
| DATED | : September 8, 2009 |
| INVENTOR(S) | : Galili et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 702 days.

Signed and Sealed this

Twenty-first Day of September, 2010

David J. Kappos
*Director of the United States Patent and Trademark Office*